US006867542B1

United States Patent
Sun et al.

(12) United States Patent
(10) Patent No.: US 6,867,542 B1
(45) Date of Patent: Mar. 15, 2005

(54) FLOATING CHIP PHOTONIC DEVICE AND METHOD OF MANUFACTURE

(75) Inventors: Xiao-Dong Sun, Schenectady, NY (US); William P. Minnear, Clifton Park, NY (US)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 09/537,192

(22) Filed: Mar. 29, 2000

(51) Int. Cl.[7] ............................. H01J 1/62; H01L 33/00
(52) U.S. Cl. .................... 313/512; 313/498; 313/501; 313/502; 257/79; 257/81; 257/98; 257/99; 257/100; 362/237; 362/240; 362/241
(58) Field of Search ................. 313/500–512; 257/98, 99; 362/800, 293

(56) References Cited

U.S. PATENT DOCUMENTS

| | | | | |
|---|---|---|---|---|
| 3,676,668 A | | 7/1972 | Collins et al. | |
| 4,114,177 A | * | 9/1978 | King | 257/81 |
| 5,167,556 A | * | 12/1992 | Stein | 445/24 |
| 5,198,479 A | * | 3/1993 | Shiobara et al. | 523/214 |
| 5,441,918 A | * | 8/1995 | Morisaki et al. | 438/118 |
| 5,618,872 A | * | 4/1997 | Pohl et al. | 524/430 |
| 5,777,433 A | * | 7/1998 | Lester et al. | 313/512 |
| 5,813,753 A | * | 9/1998 | Vriens et al. | 362/293 |
| 5,962,971 A | * | 10/1999 | Chen | 313/512 |
| 6,015,719 A | * | 1/2000 | Kish et al. | 438/29 |
| 6,121,637 A | * | 9/2000 | Isokawa et al. | 257/99 |
| 6,274,890 B1 | * | 8/2001 | Oshio et al. | 257/98 |
| 6,335,548 B1 | * | 1/2002 | Roberts et al. | 257/98 |
| 6,576,930 B2 | * | 6/2003 | Reeh et al. | 257/98 |

FOREIGN PATENT DOCUMENTS

JP          2001135768 A  *  5/2001  ........... H01L/23/50

* cited by examiner

Primary Examiner—Joseph Williams
Assistant Examiner—Sikha Roy
(74) Attorney, Agent, or Firm—Fay, Sharpe, Fagan, Minnich & McKee, LLP

(57) ABSTRACT

A solid state lamp includes a mounting area adapted to contain a light emitting diode (LED) chip and a suspension media which physically isolates the diode from the mounting area. The suspension media, while substantially optically transparent, includes suspended phosphor particles for down conversion and scattering of LED emissions. Additionally, the suspension media includes thermal conductivity additives to improve device thermal conductivity in higher power operations.

15 Claims, 2 Drawing Sheets

FLOATING CHIP PHOTONIC DEVICE AND METHOD OF MANUFACTURE

BACKGROUND OF THE INVENTION

The present invention relates to the art of solid state lamp assemblies. It finds particular application in conjunction with Light Emitting Diodes (LED's), and will be described with particular reference thereto. It is to be appreciated, however, that the present invention is also amenable to other types of light emitting semiconductor devices.

Solid state lamp assemblies such as LEDs are typically made from a flat chip of material, such as III-V nitrides gallium arsenide, and/or phosphides and silicon carbide, suitably doped with material or designed so as to form a p-n junction which emits light when current is passed therethrough. Indeed, such devices emit light from all exposed surfaces when injected with an appropriate input current. Undesirably however, the light emitted by these devices tends to be of relatively low intensity due to scattering and/or absorption.

This inefficiency has been recognized, and effort has been directed towards solving this particular problem. Typical solutions tend to focus the light emanating from the exposed chip surfaces. Exemplary methods of implementation include angling the chip mounting area, frequently a cup, to redirect emitted light, lining the mounting area with a reflective surface, shaping the diode material itself into a lens, or adding a separate lens fixture to the LED.

The present invention contemplates a new and improved method and apparatus which helps to reduce certain of the above-referenced problems and others.

BRIEF SUMMARY OF THE INVENTION

In accordance with one aspect of the present invention, a solid state lamp includes a light emitting element and a mounting area adapted to contain the element. A suspension media supportably surrounds the element within the mounting area.

In accordance with another aspect of the present invention, the suspension media comprises a substantially transparent material.

In accordance with another aspect of the present invention, the suspension media includes a first layer disposed between the mounting area and the light emitting diode element, and a second layer covering the light emitting diode element and the first layer.

In accordance with another aspect of the present invention, the first layer includes a thermally conductive filler.

In accordance with another aspect of the present invention, the first layer includes phosphor particles.

In accordance with another aspect of the present invention, the second layer includes phosphor particles.

In accordance with another aspect of the present invention, a third layer is supplied and located between the light emitting diode element and the second layer.

In accordance with another aspect of the present invention, at least one of the first or second layers includes gold or silver nano-particles.

In accordance with another aspect of the present invention, at least one of the first or second layers includes single crystal nano-particles such as diamonds.

In accordance with another aspect of the present invention, at least one of the first or second layers includes dielectric nano-particles such as fumed alumina, $TiO_2$, $SrTiO_3$, etc., to improve thermal conductivity while minimizing optic scattering.

In accordance with another embodiment of the present invention, a method of manufacturing a solid state lamp includes locating a suspension media in a mounting area where a volume of the mounting area exceeds a volume of the suspension media. The method further includes disposing a light emitting device on the suspension media.

In accordance with another aspect of the present invention, the method further includes affixing electrical leads to the light emitting device.

In accordance with another aspect of the present invention, the method further includes depositing a phosphor embedded suspension layer over the light emitting device and the suspension media.

In accordance with another embodiment of the present invention, a photonic device includes a mounting area and a spacing element which both spaces a semiconductor device from the mounting area and affixes the semiconductor device within the mounting area.

In accordance with another aspect of the present invention, the spacing element comprises an optically transparent media disposed between the mounting area and the semiconductor device.

In accordance with another aspect of the present invention, the optically transparent media includes silicone epoxy blended with phosphor particles.

In accordance with another aspect of the present invention, the optically transparent media includes silicone epoxy blended with thermally conductive fillers.

In accordance with another aspect of the present invention, the spacing element includes an optically transparent media disposed over both the semiconductor device and the spacing element.

In accordance with another aspect of the present invention, the photonic device further includes a phosphor layer disposed over the semiconductor device between the spacing element and the means for affixing.

One advantage of the present invention resides in an optic buffer or spacer blended with thermally conductive fillers to improve thermal conductivity and the refractive index of the device.

Another advantage of the present invention resides in the ability to blend phosphor particles within the suspension media for down conversion and scattering of LED emissions.

Yet another advantage of the present invention resides in the surrounding of the LED chip by the suspension media providing a channel for the light output from all surfaces of the chip.

Still further advantages and benefits of the invention will become apparent to those of ordinary skill in the art upon reading and understanding the following detailed description of the preferred embodiments.

BRIEF DESCRIPTION OF THE DRAWINGS

The invention may take form in various components and arrangements of components, and in various steps and arrangements of steps. The drawings are only for purposes of illustrating the preferred embodiments and are not to be construed as limiting the invention.

DETAILED DESCRIPTION OF THE PREFERRED EMBODIMENTS

Figure 1:
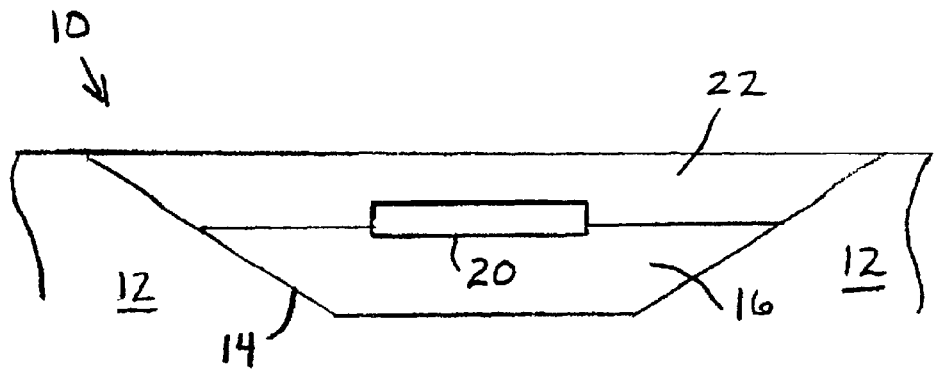
FIG. 1 is a cross section of an LED photonic device in accordance with the present invention.

With reference to FIG. 1, a photonic device 10 such as the LED illustrated includes a metal mount 12 defining a mounting area or cup 14. A first layer of suspension media 16, such as silicone epoxy, is deposited into the cup 14. Those skilled in the art will appreciate that the silicone epoxy 16 can be pure or filled with additives to improve thermal conductivity, to adjust the refractive index, and/or to down convert the emission from an LED and scatter light. The viscosity of the silicone epoxy 16 is adjusted, for example by fillers or mild curing, to an extent that a deposited LED chip will stick to and sit upon the first layer 16 without settling appreciably. At this point, an LED chip 20 is placed upon the first layer 16. Either an upper face (with an electrode pad), or a bottom face (sapphire) of the LED chip 20 is usable in this configuration as a mounting face. Those skilled in the art will appreciate that if electrical leads were not previously applied to the LED chip 20, such wiring can now be bonded to the chip and to the electrode legs (not shown).

A second layer of silicone epoxy 22 is deposited over the exposed face of the LED chip 20 and the cured first layer 16. In the illustrated embodiment, the second layer 22 includes suspended phosphor particles blended into the silicon epoxy to improve down-conversion and scattering of LED emissions. A conventional curing process, such as thermal/UV curing, is then performed on the silicone phosphor blend. Those skilled in the art will appreciate that conventional epoxy packaging such as forming a dome shaped epoxy onto the mounted LED, can now occur as desired.

Figure 2:
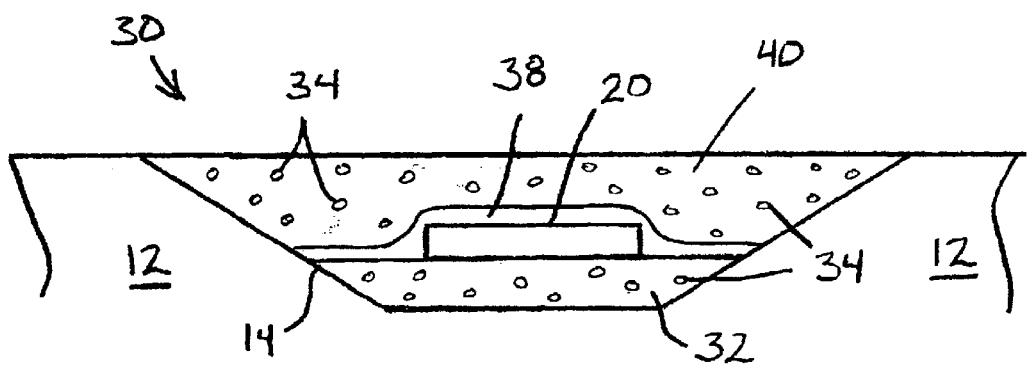
FIG. 2 is a cross section of an LED photonic device according to an alternate embodiment of the present invention; and, FIG. 3 is a cross section of an LED photonic device according to an alternate embodiment of the present invention.

With reference now to FIG. 2, a floating chip LED 30 includes a metal mount 12 defining an LED mounting area or cup 14. A first layer of silicone epoxy suspension media 32 is blended with thermally conductive fillers 34 (enlarged for illustration) to improve thermal conductivity for higher power LED operations. In one embodiment, thermal conductivity filler 34 includes blended gold (Au) or silver (Ag) nano-particles which are commercially available. The concentration of gold/silver nano-particles is controlled to enhance the thermal conductivity without shorting the LED circuit. This blend enhances thermal conductivity while not inducing optical scattering due to the nanometer size of the particles 34. In another embodiment, the thermal conductivity filler 34 can include single crystal or dielectric nano-particles. Exemplary single crystal particles include diamonds, while dielectric particles include various oxides such as fumed alumina, $TiO_2$, $SrTiO_3$, etc. These nano-particles are also commercially available. These particles contribute to improved thermal conductivity while not inducing optical scattering. The resulting composite layer is still an electric insulator, but the addition of high dielectric constant additives improves the light extraction from the LED by increasing the refractive index of the silicone composite layer 32.

The device 30 also includes an LED chip 20 placed on the first layer 32. As above, wire bonding can alternately occur prior to placement, or after the first layer 32 has been sufficiently cured. In the illustrated embodiment, a phosphor layer 38 is deposited directly on the upper surface of the LED 20 and over the first layer 32. Those skilled in the art will recognize that the phosphor layer 38 acts to down convert the light emitted from the LED. A second suspension layer 40, substantially identical to the first suspension layer 32, is provided over the phosphor layer 38 to hold the LED chip 20 in place, and improve thermal conductivity by the addition of thermal conductivity fillers 34.

Figure 3:
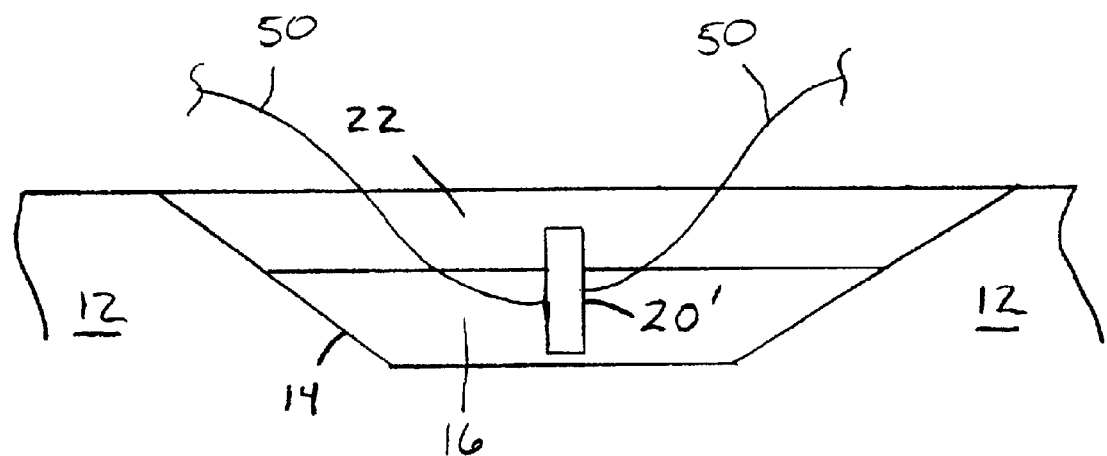

With reference now to FIG. 3, an alternate embodiment is illustrated which also increases the surface area from which an LED chip 20' emits light. Substantially as above, a first layer 16 is deposited into an LED cup or lead frame 14. The first layer 16 is then at least partially cured so that it will support the LED chip 20' within the cup 14. While the chip 20' is illustrated as being fully suspended within the cup 14, those skilled in the art will appreciate that the chip 20' can alternately rest on the base of the cup while still providing enhanced efficiency of emitted light. A second layer 22 is then deposited over both the LED chip 20' and the first layer 16 to further support the chip 20' and electrical leads 50. As above, the suspension media 16, 22 may be dispersed with additives to improve thermal efficiency and/or quality of output light.

The invention has been described with reference to the preferred embodiments. Modifications and alterations will occur to others upon a reading and understanding of the preceding detailed description. It is intended that the invention be construed as including all such modifications and alterations insofar as they come within the scope of the appended claims or the equivalents thereof.

What is claimed is:

1. A solid state lamp comprising:

a light emitting element;

a mounting area adapted to contain the light emitting element; and, a suspension media disposed between said mounting area and said light emitting element which supportably surrounds the light emitting element within the mounting area.

2. The solid state lamp as set forth in claim 1, wherein the suspension media comprises a substantially optically transparent material.

3. The solid state lamp as set forth in claim 1, wherein the suspension media includes a first layer disposed between the mounting area and the light emitting element, the suspension media further comprising:

a second layer covering the light emitting element and the first layer.

4. The solid state lamp as set forth in claim 3, wherein selected ones of the first layer and the second layer comprise a thermally conductive filler.

5. The solid state lamp as set forth in claim 3, wherein selected ones of the first layer and the second layer comprise phosphor.

6. The solid state lamp as set forth in claim 3, further comprising a third layer disposed between the light emitting element and the second layer.

7. The solid state lamp as set forth in claim 4, wherein the thermally conductive filler comprises at least one nano-particle selected from the set of gold and silver.

8. The solid state lamp as set forth in claim 3, wherein at least one of the first layer and the second layer comprises single crystal nano-particles.

9. The solid state lamp as set forth in claim 3, wherein at least one of the first layer and the second layer comprises dielectric nano-particles.

10. The solid state lamp of claim 1, wherein said mounting area comprises a metal cup.

11. A photonic device comprising:

a mounting area;

a spacing element which spaces a semiconductor device from the mounting area;

means for affixing the semiconductor device substantially within the mounting area which affixing means comprises of an optically transparent media disposed over the semiconductor device and the spacing element, the spacing element and the affixing means surroundingly support the semiconductor device in a suspended state within the mounting area;

wherein the spacing element includes an optically transparent media disposed between the mounting area and the semiconductor device.

12. The photonic device as set forth in claim 11, wherein the optically transparent media disposed between the mounting area and the semiconductor device comprises silicone epoxy blended with phosphor particles.

13. The photonic device as set forth in claim 11, wherein the optically transparent media disposed between the mounting area and the semiconductor device comprises silicone epoxy blended with thermally conductive fillers.

14. The photonic device as set forth in claim 11 further comprising a phosphor layer disposed over the semiconductor device between the spacing element and the means for affixing the semiconductor device.

15. The photonic device of claim 11 wherein said mounting area comprises a metal cup.

* * * * *